(12) United States Patent
Novosel et al.

(10) Patent No.: US 6,775,197 B2
(45) Date of Patent: Aug. 10, 2004

(54) NON-VOLATILE MEMORY ELEMENT INTEGRATABLE WITH STANDARD CMOS CIRCUITRY AND RELATED PROGRAMMING METHODS AND EMBEDDED MEMORIES

(75) Inventors: David Novosel, New Wilmington, PA (US); Gary S. Craig, Carnegie, PA (US)

(73) Assignee: Novocell Semiconductor, Inc., Pittsburgh, PA (US)

( * ) Notice: Subject to any disclaimer, the term of this patent is extended or adjusted under 35 U.S.C. 154(b) by 0 days.

(21) Appl. No.: 10/306,572

(22) Filed: Nov. 27, 2002

(65) Prior Publication Data

US 2004/0100850 A1 May 27, 2004

(51) Int. Cl.[7] ............................................. H01H 37/76
(52) U.S. Cl. ................. 365/225.7; 365/96; 365/189.07; 365/189.09; 327/525
(58) Field of Search ............................... 365/225.7, 96, 365/189.07, 189.09; 327/525

(56) References Cited

U.S. PATENT DOCUMENTS

| | | | |
|---|---|---|---|
| 4,569,120 A | 2/1986 | Stacy et al. ................... 29/574 |
| 4,569,121 A | 2/1986 | Lim et al. ...................... 29/574 |
| 4,748,490 A | 5/1988 | Hollingsworth .............. 357/51 |
| 4,881,114 A | * 11/1989 | Mohsen et al. ............. 257/530 |
| 4,943,538 A | * 7/1990 | Mohsen et al. ............. 438/215 |
| 5,056,061 A | 10/1991 | Akylas et al. |
| 5,110,754 A | 5/1992 | Lowrey et al. |
| 5,148,391 A | * 9/1992 | Zagar ........................... 365/96 |
| 5,241,496 A | 8/1993 | Lowrey et al. ................ 365/96 |
| 5,315,177 A | * 5/1994 | Zagar et al. ................... 326/44 |
| 5,426,614 A | 6/1995 | Harward ................... 365/225.7 |
| 5,703,804 A | 12/1997 | Takata et al. |
| 5,815,429 A | * 9/1998 | Sher et al. ..................... 365/96 |
| 5,896,041 A | * 4/1999 | Sher et al. ..................... 326/38 |
| 6,088,282 A | 7/2000 | Loughmiller et al. |
| 6,111,302 A | 8/2000 | Zhang et al. |
| 6,130,469 A | 10/2000 | Bracchitta et al. |
| 6,130,834 A | 10/2000 | Mullarkey et al. |
| 6,140,837 A | 10/2000 | Eaton et al. |
| 6,154,410 A | 11/2000 | Cutter et al. |
| 6,163,488 A | 12/2000 | Tanizaki et al. |
| 6,201,725 B1 | 3/2001 | Yao et al. |
| 6,215,701 B1 | 4/2001 | Yao et al. |
| 6,246,623 B1 | 6/2001 | Ingalls |

(List continued on next page.)

OTHER PUBLICATIONS

Copending U.S. patent application Ser. No. 10/305,735 filed Nov. 27, 2002 Method of Utilizing A Plurality of Voltage Pulses To Program Non–Volatile Memory Elements and Related Embedded Memories (NVCL:004).

Copending U.S. patent application Ser. No. 10/306,571 filed Nov. 27, 2002 "Method Of Utilizing Voltage Gradients To Guide Dielectric Breakdowns For Non–Volatile Memory Elements and Related Embedded Memories" (NVCL:003).

*Primary Examiner*—Viet Q. Nguyen
(74) *Attorney, Agent, or Firm*—O'Keefe, Egan & Peterman, LLP

(57) ABSTRACT

A non-volatile memory cell and associated programming methods are disclosed that allow for the integration of non-volatile memory with other integrated circuitry utilizing the standard CMOS processing used to manufacture the CMOS circuitry. A capacitor element is used to provide programming voltages to the non-volatile memory cell. And in one embodiment, the non-volatile memory cell includes an antifuse element having a programming node and a capacitor coupled to the programming node, such that the antifuse element is configured to have reduced resistivity after the programming node is subjected to one or more voltage pulses with the change in resistivity representing a change in logic state, and such that the capacitor element is configured to provide the voltage pulses to the programming node.

29 Claims, 6 Drawing Sheets

U.S. PATENT DOCUMENTS

| | | |
|---|---|---|
| 6,249,472 B1 | 6/2001 | Tamura et al. |
| 6,288,437 B1 | 9/2001 | Forbes et al. |
| 6,333,666 B2 | 12/2001 | Kim et al. |
| 6,333,667 B2 | 12/2001 | Lee |
| 6,344,373 B1 | 2/2002 | Bhattacharyya et al. |
| 6,366,118 B2 | 4/2002 | Oh et al. |
| 6,445,605 B1 | 9/2002 | Mullarkey et al. |
| 6,456,546 B2 | 9/2002 | Kim et al. |
| 6,469,923 B1 | 10/2002 | Hidaka |
| 6,477,094 B2 | 11/2002 | Kim et al. |
| 6,570,805 B2 | 5/2003 | McCollum ............... 365/225.7 |
| 6,574,145 B2 | 6/2003 | Kleveland et al. ...... 365/185.19 |
| 6,642,603 B1 | 11/2003 | Knall .......................... 257/530 |
| 2002/0074616 A1 * | 6/2002 | Chen et al. .................. 257/516 |
| 2003/0021142 A1 | 1/2003 | Knall .......................... 365/130 |
| 2003/0169095 A1 * | 9/2003 | Kothandaraman .......... 327/525 |
| 2003/0201819 A1 * | 10/2003 | Zheng et al. ............... 327/525 |
| 2003/0218924 A1 | 11/2003 | Duval et al. ................ 365/200 |

* cited by examiner

NON-VOLATILE MEMORY ELEMENT INTEGRATABLE WITH STANDARD CMOS CIRCUITRY AND RELATED PROGRAMMING METHODS AND EMBEDDED MEMORIES

TECHNICAL FIELD OF THE INVENTION

This invention relates to non-volatile memories, and more particularly, to embedded memories for combination with other integrated circuitry.

BACKGROUND

Data in digital systems, such as computers, cell phones, automotive and industrial controllers, etc. is generally stored in volatile and non-volatile memories. Volatile storage refers to data that is only valid while power is maintained, while non-volatile memory will maintain data even without power. There are existing non-volatile memory solutions such as EPROM, EEPROM, and Flash memories as well as ROM. ROM is fabricated with a fixed data pattern, which can never be altered. ROM is useful, therefore, when the information to be stored is known at the time of manufacture. Many applications, however, need to store information during operation or after installation. Those that only need a small amount of operational storage, such as calibration data for analog settings and configuration data for digital systems that have built in flexibility, can utilize memory that can be written with the needed parameters determined during installation or during a calibration process and that can then be accessed to provide the stored parameters during future operations.

For this reason, it is often desirable to include with other integrated circuitry memory that can be written with data so that a single integrated circuit can provide both operational functions and the data storage functions. Usually, memory combined in such a integrated circuit is referred to as embedded memory, because the memory is added into the digital design. One difficulty, however, is that the processes utilized to manufacture memory circuitry may not be compatible with the processes used to manufacture the logic, control or other integrated circuitry.

EPROM, EEPROM and Flash memory are all types of memory that store information by writing to the device during operation and would, therefore, be desirable for embedded applications. However, these devices generally use a storage transistor that has a floating gate, and charge is added or subtracted from this floating gate to store the binary states. Problematically, these floating gate technologies are normally fabricated on processes specifically tailored to the floating gate implementations. And the manufacturing process to make these floating gate devices is more complicated and more costly than standard CMOS technology. In addition, the floating gate processes will generally produce a lower performance logic (or digital) device because the additional processing required for the floating gate devices will often cause changes (generally degradation) in the performance of the basic CMOS transistors. Thus, high performance digital devices and floating gate memories are typically not compatible within the same integrated circuit. For this reason, it is difficult to maintain a high performance digital system with Flash memory added to a single integrated circuit.

Non-volatile memory solutions have been fabricated as stand alone components for many years, and these solutions have utilized various memory cell structures. Early memories were made of arrays of fuses which could be selectively blown by high current. A fuse device typically refers to a device that starts as a low resistance element (i.e., short circuit) and is made to be a high resistance element by some action, such as high current. This fuse method was often used in bipolar technology because high currents are needed for writing or to blow the fuse and because bipolar transistors can deliver large currents.

Antifuse devices were also developed for non-volatile data storage. An antifuse structure refers to a device that starts as a high value resistance and is altered (i.e., in writing) to have a much lower value of resistance. Since these devices work in reverse of fuse elements, they are called antifuse elements. Typically, antifuse elements require some particular manufacturing characteristics to permit the formation of devices that can be altered as antifuse devices. Problems with antifuse implementations have included reliability issues associated with large variations in the final resistance of different antifuse elements that had been written. Thus, the use of antifuse elements has been limited. Other antifuse devices have been developed that use special features of a manufacturing process to make an antifuse element, such as using oxide-nitride-oxide (ONO) as a dielectric in the antifuse elements. This ONO structure has been used in DRAM manufacturing processes, but this ONO structure has not been generally available in standard CMOS processes for other types of CMOS integrated circuits.

SUMMARY OF THE INVENTION

The present invention provides a non-volatile memory cell and associated programming methods that allow for the integration of non-volatile memory with other integrated circuitry utilizing the standard CMOS processing used to manufacture other CMOS circuitry. The non-volatile memory cell structure and related programming methods and embedded memories of the present invention, therefore, provide a desirable solution for embedded memory architectures.

In one embodiment, the present invention is a non-volatile memory cell integratable with other CMOS circuitry, including an antifuse element having a programming node and a capacitor element coupled to the programming node. The antifuse element is configured to have reduced resistivity after the programming node is subjected to one or more voltage pulses, the change in resistivity representing a change in logic state. And the capacitor element is configured to provide the one or more voltage pulses to the programming node.

In another embodiment, the present invention is a method of operating a non-volatile memory cell integratable with other CMOS circuitry, including providing a non-volatile memory cell, including a antifuse element having a programming node and a capacitor coupled to the programming node, and writing to the non-volatile memory cell by applying one or more voltage pulses to the capacitor element. The antifuse element is configured to have reduced resistivity after the programming node is subjected to one or more voltage pulses, the change in resistivity representing a change in logic state. And the capacitor element is configured to provide the one or more voltage pulses to the programming node.

Still further, the present invention is an embedded non-volatile memory integrated with other CMOS circuitry, including a plurality of non-volatile memory cells and write circuitry. Each non-volatile memory cell includes an antifuse element having a programming node, a capacitor element coupled to the programming node and an access element coupled to the programming node. The antifuse element is configured to have reduced resistivity after the programming node is subjected to one or more voltage pulses, the change in resistivity representing a change in logic state. The capacitor element is configured to provide the one or more voltage pulses to the programming node. And the access element is configured to allow determination of the logic state for the antifuse element. The write circuitry is coupled to the capacitor elements of the plurality of non-volatile memory cells, and the write circuitry is configured to generate and to provide one or more voltage pulses to the capacitor elements.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

The present invention provides non-volatile memory cell and associated programming methods that allow for the integration of non-volatile memory with other CMOS circuitry utilizing the standard CMOS processing used to manufacture other CMOS circuitry. Thus, the non-volatile memory cell structure and programming methods of the present invention provide a desirable solution for embedded memory architectures.

Figure 1A:
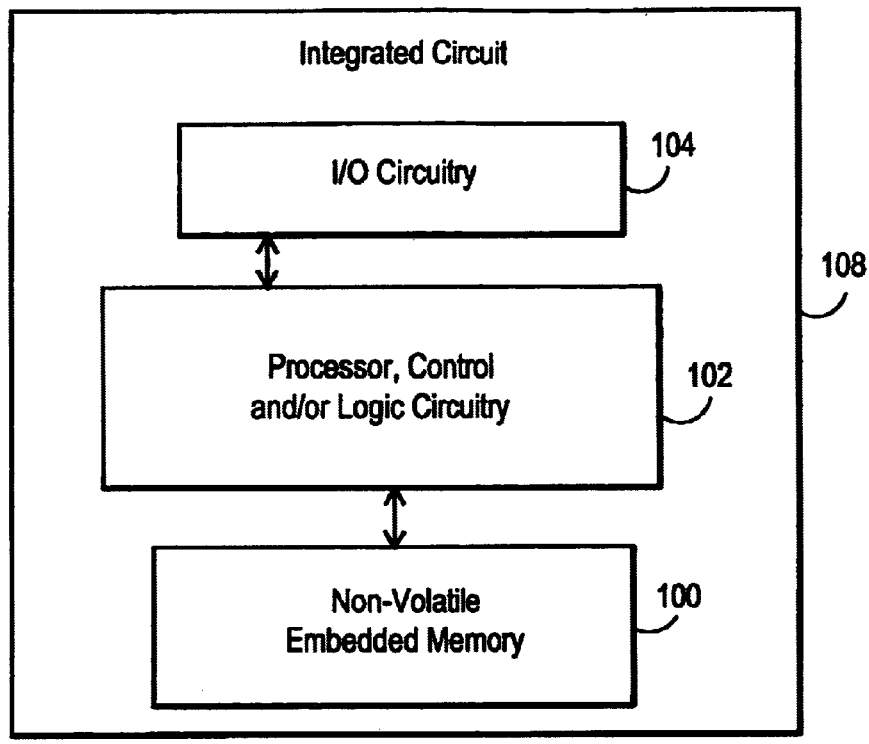
FIG. 1A is a block diagram for integrated circuit including embedded non-volatile memory according to the present invention.

FIG. 1A is a block diagram for integrated circuit 108 including embedded non-volatile memory 100 according to the present invention. As discussed in more detail below, the non-volatile memory cell architecture of the present invention lends itself to being manufactured using standard CMOS processing. Thus, rather than requiring additional processing steps or post processing combination, the embedded non-volatile memory of the present invention can be fabricated at the same time the other CMOS circuitry is being fabricated. As such, integrated circuit 108 can include a wide variety of other circuitry as represented by input/output (I/O) circuitry 104 and processor, control and/or logic circuitry 102. It is noted, therefore, that the actual circuitry fabricated with embedded non-volatile memory 100 could vary depending upon the operational functionality desired.

Figure 1B:
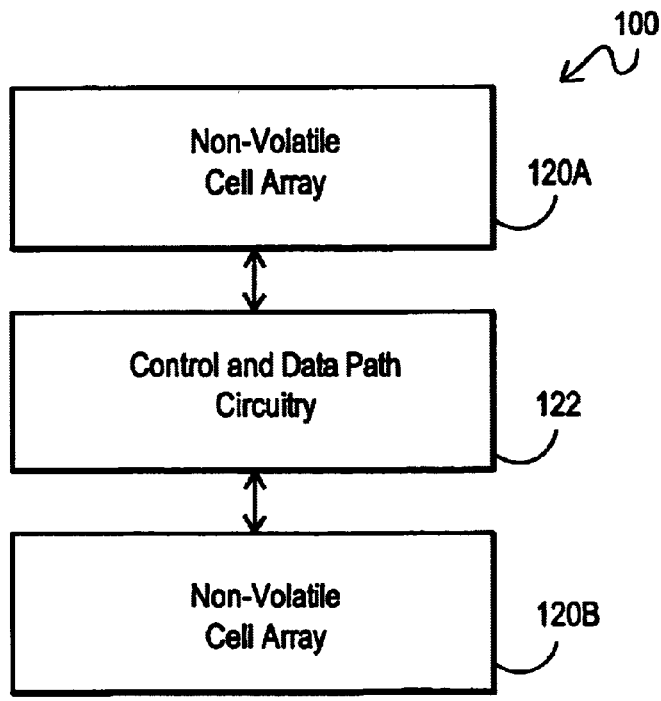
FIG. 1B is a block diagram for an embedded non-volatile memory block including a dual bank cell array.

FIG. 1B is a block diagram for an embedded non-volatile memory block 100. In the embodiment depicted, the embedded non-volatile memory block 100 has been broken in to a dual bank array so that non-volatile cell array 120A and non-volatile memory cell array 120B make up the available memory for the memory block 100. Also shown is control and data path circuitry 122 that provides control and communication functions for the memory array block 100. It is noted that the actual circuitry implemented for the memory block 100 could vary depending upon the operational functionality desired.

Figure 2:
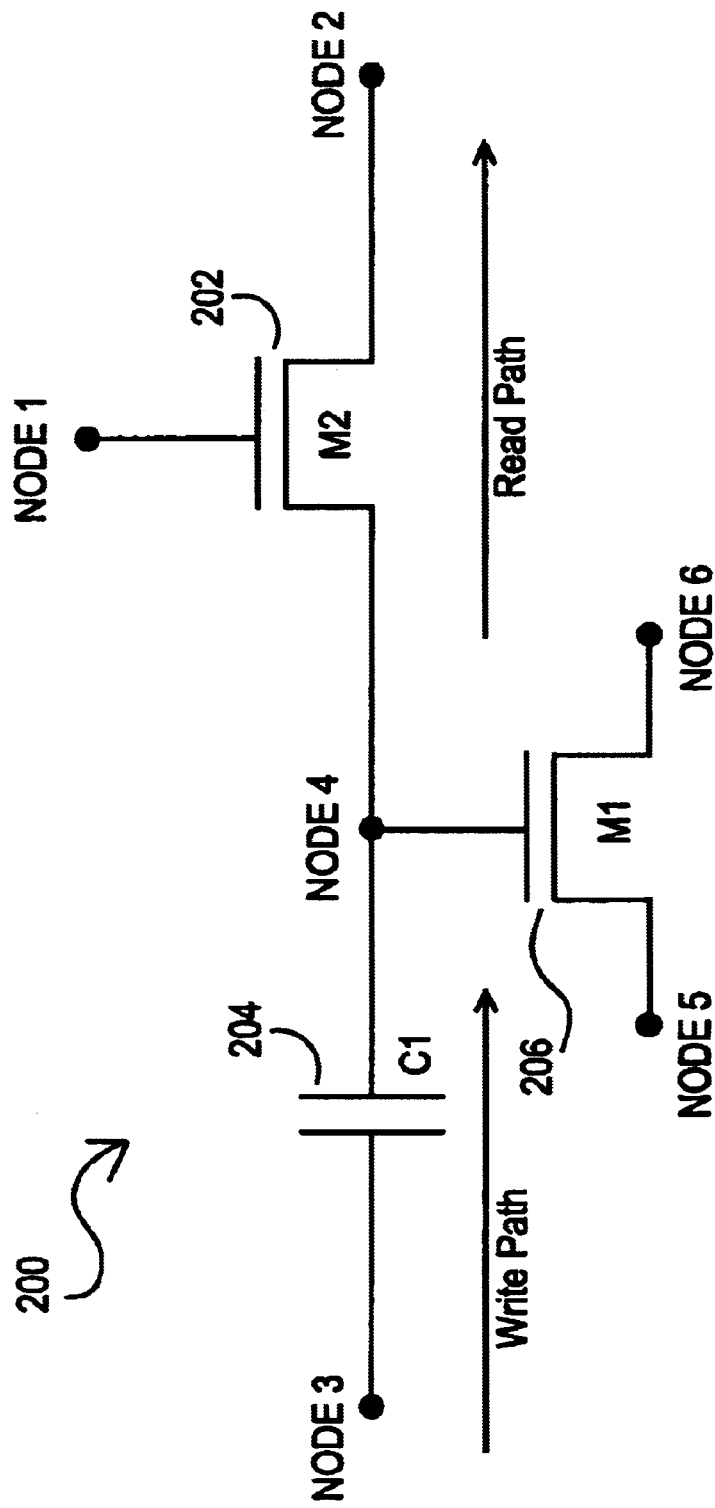
FIG. 2 is a circuit diagram for a non-volatile memory element according to the present invention including an antifuse element M1, a writing capacitor C1 and an access transistor M2.

FIG. 2 is a circuit diagram for a non-volatile memory element 200 according to the present invention including an antifuse element (M1) 206, a writing capacitor (C1) 204 and an access transistor (M2) 202. In operation, NODE 1 is connected to the gate of the access transistor M2 to control its operation. NODE 2 is coupled through the access transistor M2 to the internal NODE 4. The capacitor C1 is connected between NODE 3 and NODE 4. NODE 4 is connected to the gate of antifuse element transistor M1. NODE5 is connected to the source of the transistor M1, and NODE 6 is connected to the drain of transistor M1. As shown, the transistors are NMOS devices. It is noted that PMOS transistors or other device types could be utilized, if desired, for the access device. The capacitor C1 may be a MOS transistor connected such that the gate provides one terminal of the capacitor C1 and such that the source and drain are connected together to provide the other terminal of the capacitor C1. The capacitor C1 could also be formed through other techniques, as desired, such as being formed by using by two conductive layers of metal or polysilicon and a dielectric layer to form a capacitor structure.

The non-volatile memory element 200 advantageously utilizes an antifuse element 206 that can be fabricated in standard CMOS processes without requiring special processing. This antifuse element 206 can be formed, for example, by using a standard gate oxide dielectric as an insulator. This insulator can then be made to become conductive by electrical means. For example, insulating layers, such as silicon dioxide ($SiO_2$), can have a voltage applied across them, and the insulator will not permit current to flow. If a sufficiently high field is applied, however, the oxide will break down and cause a fast discharge of the voltage across the oxide. This rapid discharge usually results in a change in the oxide or damage to the oxide that eliminates its insulating characteristic, so that the oxide will now conduct electrical current. This change in resistivity or conductive state can be used to represent the logic state of the antifuse element.

To cause the dielectric to become conductive, a voltage of sufficient magnitude must typically be applied across the dielectric. Oxides will generally become conductive with exposure to high voltages where stress is induced and charge is conducted through the oxides. Thick oxides generally behave in a manner that is typical of insulators, that is they will tolerate an increasing field until a certain high potential, then the oxide will break down. Below this breakdown, there is only a small current (called Fowler-Nordheim tunneling). Then, at a certain voltage level, the current will rise sharply, and significant charge will flow through the oxide. If the current is large enough, damage will occur to the oxide, and the oxide will become conductive. In some cases, one breakdown event may not be enough to cause the oxide to change permanently to a conductive state. Rather, a series of breakdown events are needed to cause the oxide to become conductive. In thinner oxides, there can be other modes of conduction, such as direct tunneling, and these currents may prevent the easy build up of voltage across the oxide. As the voltage increases, the current through the oxide will increase, and likewise the current will decrease if the voltage is decreased. These oxides must typically conduct a significant amount of charge before the insulating characteristics are lost. This charge to breakdown amount ($Q_{bd}$) must be driven through the insulator to cause it to change states, from an insulator to a conductor.

In particular, in the embodiment of FIG. 2, the transistor M1 is the dielectric breakdown device or antifuse element. In one example, NODES 5 and 6 are held near zero volts or ground, and NODE 4 is driven to a high voltage for writing to the antifuse device M1. To drive NODE 4 to a high voltage level, a pre-charge step may be used in conjunction with a voltage boost step. In the pre-charge step, transistor M2 is used to charge up the programming NODE 4 to a first pre-charge voltage level. To effect this pre-charge step, a voltage, such as a voltage near the supply voltage (Vdd) or preferably a pumped supply voltage (Vpp), is applied to NODE 2 of the access transistor M2, and a voltage at least a Vth above the Vpp level is applied to NODE 1 (Vpp+Vth, where Vth is the threshold voltage of M2). This pre-charge step will drive NODE 4 to Vpp level. In the voltage boost operation, NODE 4 is first isolated by reducing the voltage at NODE 1 to a Vpp level or below thereby turning "off" the access transistor M2. To boost the voltage at NODE 4 to the high voltage needed for writing or breaking down the dielectric of the antifuse element M1, a Vpp level voltage pulse is applied to NODE 3 of capacitor C1. Due to the nature of capacitors, this action causes NODE 4 to rise along with NODE 3, thereby raising NODE 4 to a high level voltage, for example, of approximately 2-times Vpp or 2Vpp, assuming NODE 4 was pre-charged to a Vpp voltage level. Thus, this circuit configuration allows for raising the internal programming voltage within the non-volatile memory cell to a higher voltage, such as a voltage that is two-times or more than the voltages being applied to the capacitor C1 and the access transistor M2.

In this write operation, therefore, the disclosed memory cell structure of FIG. 2 can double the applied voltage inside the memory element or cell 200. This capability of doubling the applied voltage in the cell is a significant benefit of the disclosed structure. This feature, therefore, allows the memory cell to be made without high voltage transistors throughout the design by confining the high voltage to a single node in the memory cell. This doubling within the cell allows the other circuitry that drives the memory core to operate at lower voltages, for example, at Vcc or Vpp. Special high voltage transistors are not required to deliver to the memory core the high voltages that are needed to write the memory elements. In the structure of FIG. 2, the high voltage appears across the dielectric of antifuse element M1 and is confined to NODE 4. In the example above, therefore, the voltage across the access transistor M2 and capacitor C1 is Vpp, and the voltage across the dielectric of the antifuse element M1 is 2Vpp. It is noted that the FIG. 2 depicts the use of an antifuse element M1 that is capable of being written to once because the dielectric breakdown is typically not reversible once it has occurred. However, the internal memory cell voltage doubling technique could also be used with other memory elements that could be re-writable, if desired. It is further noted that the voltage boosting technique of the present invention could be utilized to drive the internal programming voltages of the non-volatile memory cell to an even higher voltages that exceed a voltage that is double the voltage being applied to the capacitor or to the access devices for the non-volatile memory cell, if such higher voltages were desired for a particular implementation. In addition, the voltage boosting technique could also be used to generate internal programming voltages that are higher then the applied voltages but lower than double the applied voltages. In short, a wide range of elevated voltages could be achieved, as desired, utilizing the capacitor voltage boosting technique of the present invention.

To read the state of the antifuse element M1, a voltage is applied across the antifuse element and then read circuitry will detect if there is a current flow through the dielectric of the antifuse element. For example, NODE 2 can be driven to an initial voltage, such as 1 volt, and NODE 1 can be driven to a positive voltage, such as Vdd. If the dielectric within the antifuse element M1 is conducting, a current will flow from NODE 2, through transistor M2 to NODE 4 and then to NODE 5 and/or NODE 6 through the dielectric of antifuse M1. If the dielectric within the antifuse element M1 is not conducting, then there would be no current flowing from NODE 2 to the antifuse element M1. The current flow determination and the no current flow determination are then used to determine the resistivity state of the antifuse element and thereby to determine the logic state of the non-volatile memory cell 200. For example, dielectric breakdown and associated current flow could define a logic "1," and no dielectric breakdown and no current flow could define a logic "0."

As indicated above with respect to FIGS. 1A and 1B, the memory cell structure 200 of FIG. 2 can be used in an array of write-once memory cells, and the read selection of an individual cell can be done by the respective voltages applied to the NODE 1 and NODE 2 of the individual cells. For example, NODE 1 could be used to select a row of non-volatile memory cells in an array, while the column could be selected through NODE 2. This implementation is further discussed with respect to FIG. 5B below.

Figure 3A:
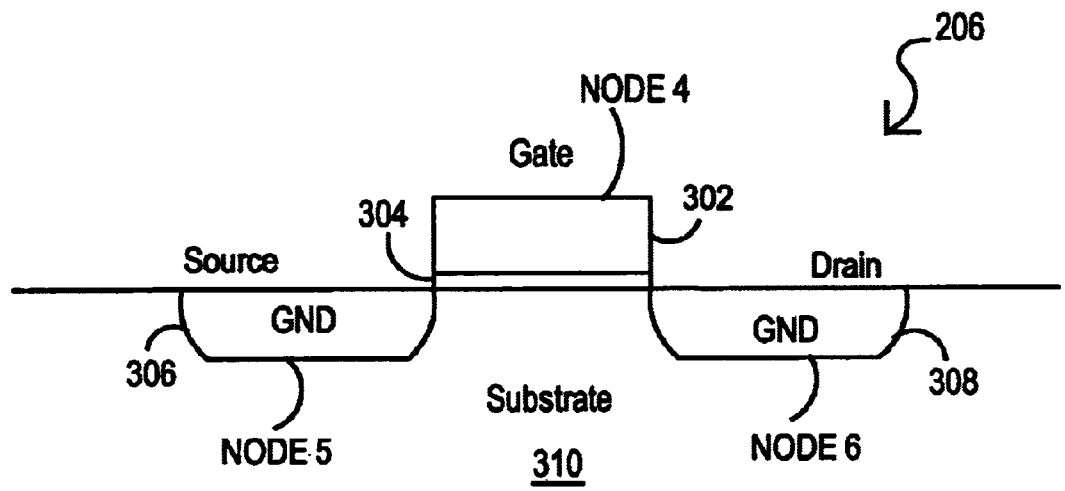
FIG. 3A is a cross-section diagram for the non-volatile antifuse element M1.

Advantageously, therefore, the benefits of the non-volatile embedded memory cell structure of the present invention include: (1) a programming voltage generated internally so the memory cell, (2) no high voltage transistors needed for routing the high programming voltage to the memory cell, (3) unique selection of the memory cell is possible through the use of NODE 1 and NODE 2, and/or (4) no special structures, special processing techniques and/or process modifications are required to integrate the non-volatile memory cell structure with other CMOS circuitry, FIG. 3A is a cross-section diagram for the non-volatile antifuse element (M1) 206. In this embodiment, for the antifuse element 206 is fabricated as an NMOS transistor device. For example, the substrate 310 can be p-type with an n-type channel existing between the source 306 and the drain 308, which are both n-type. The gate 302 sits above the channel region and sits on top of a dielectric layer 304. With respect to FIG. 2, NODE 4 is connected to the gate 302, NODE 5 is connected to the source 306, and NODE 6 is connected to the drain 308. In addition, as depicted in FIG. 3A, the source 306 and the drain 308 are both coupled to a ground voltage level. It is noted that other device types could be utilized for the antifuse element, such as PMOS transistor devices, devices that have a dielectric layer positioned between two conductive layers, and/or any other device element that is configured to have reduced resistivity after a programming node is subjected to one or more voltage pulses such that a change in resistivity can represent a change in logic state.

The dielectric 304, usually silicon dioxide, requires that a certain amount of current pass through an area of the oxide to cause it to become conductive. In thicker dielectrics, this breakdown can happen rather quickly when a large voltage is applied. Thus, a very high but very short pulse of current will often cause conduction and will generally cause conduction in the weakest part or parts of the dielectric, such as defect or charge trap locations. If there are several weak spots in the oxide, then current will often be shared through these weak areas. In thinner dielectrics, however, the oxide will conduct current more uniformly across the area of the dielectric. As a voltage is applied, the oxide will conduct and load down the applied voltage, thereby tending to decrease the voltage across the oxide. In most cases, the available current is limited. As such, it is desirable to minimize the oxide area that is conducting and to concentrate the current in as small of an area as possible. This concentration will reduce the total amount of current that is needed to conduct through the oxide to cause breakdown and/or will reduce the time that is needed to achieve breakdown of the oxide.

With respect to FIG. 3A and dielectric 304, therefore, it is desirable to fabricate the antifuse element 206 with a minimal area for the dielectric 304. For example, the area of the dielectric 304 may be fabricated using minimum dimensions for the gate oxide area that are allowed with respect to the integrated circuit being fabricated. These minimum dimensions are typically provided by the manufacturer, and no structure can typically be used in the layout of the memory element that is smaller than the dimensions allowed by the manufacturing processes being utilized.

Figure 3B:
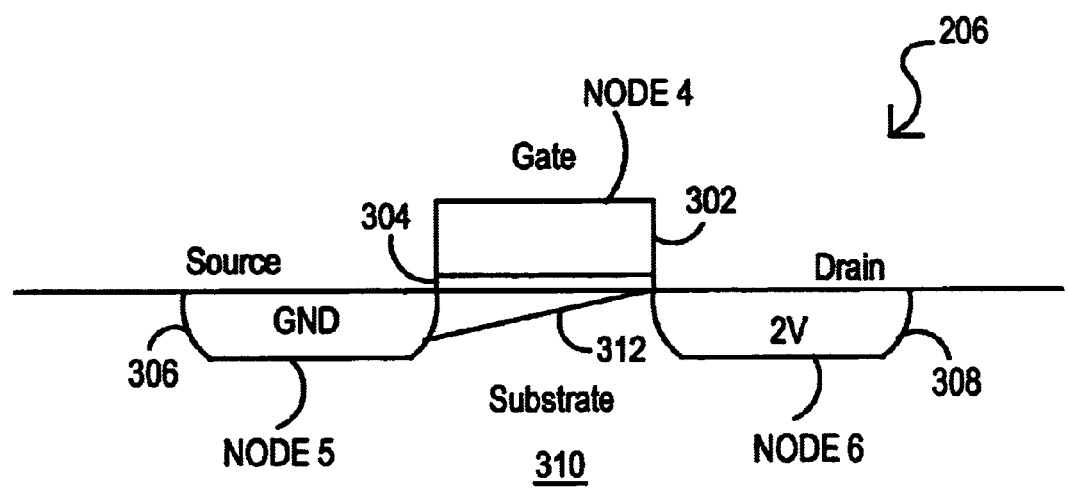
FIG. 3B is a cross-section diagram for an alternative embodiment for the non-volatile antifuse element M1 in which a voltage gradient is utilized.

FIG. 3B depicts a technique that can be used to further reduce the effective area of the dielectric for the memory element by generating a lateral electric field to concentrate the current flow through the dielectric. FIG. 3B is a cross-section diagram for an alternative embodiment for the non-volatile antifuse element M1 in which a voltage gradient is utilized. The enhancement added to FIG. 3B over FIG. 3A is the application of a higher voltage, such as 2 volts, to the drain 308 as compared to the voltage applied to the source 306, such as ground. The voltage difference between the drain 308 and the source 306 creates a voltage gradient 312 across the channel region of the transistor M1.

The voltage gradient across the channel causes the voltage from the gate to the channel to vary from one end of the channel to the other. The end of the channel that has the higher voltage applied will have less vertical field across the oxide than the end of the channel with the lower voltage applied. Because the current through the oxide is dependent on the voltage across the oxide, the area of the gate where the highest voltage difference appears tends to be the area that conducts the most current. If the gate voltage is uniform across its entire area, the voltage across the oxide will then depend on the voltage of the channel region below the gate. For example, where 2 volts and ground are used as different voltage levels to create a voltage gradient, the end of the channel with 2 volts applied will have about Vgate-2 volts applied across the dielectric, where as the end of the channel at ground will have the full Vgate applied voltage applied across the dielectric. This voltage gradient will cause the current to crowd into the area where the highest field is applied and thereby reduce the current in the rest of the channel.

In thick oxides, the concentration of current near the source will likely cause the dielectric to breakdown quickly because fewer weak spots in the dielectric have the highest electric field applied to them. This concentration will reduce the time and current needed to break down the thicker dielectric and will cause the breakdown to be near the source. With the breakdown near the source, the resistance of the final programmed memory element will also be reduced because the electric path will be from the source to a path in the oxide near the source. If the voltage gradient is not present in the channel of the transistor, the breakdown can occur anywhere in the channel. If the breakdown is in the center of the channel, for example, then the current path will be longer and result in a higher total resistance.

In thin oxides, the amount of current (or charge called $Q_{bd}$—charge to breakdown) needed to break down the oxide is relatively large because the oxide is typically uniform and will conduct current throughout the entire area of the oxide. This current flow through the oxide slowly causes a degradation. Because there is usually a limited amount of current available, it is desirable to concentrate this current into the smallest area possible. The voltage gradient across the channel, such as that depicted in FIG. 3B, will tend to cause the highest electrical field to appear in the region of the channel near the source. And the field will decrease as the distance from the source increases, causing less current to flow in those areas. This voltage gradient, therefore, will effectively concentrate the current in the area near the source and reduce the total amount of current needed to breakdown the structure.

Figure 4A:
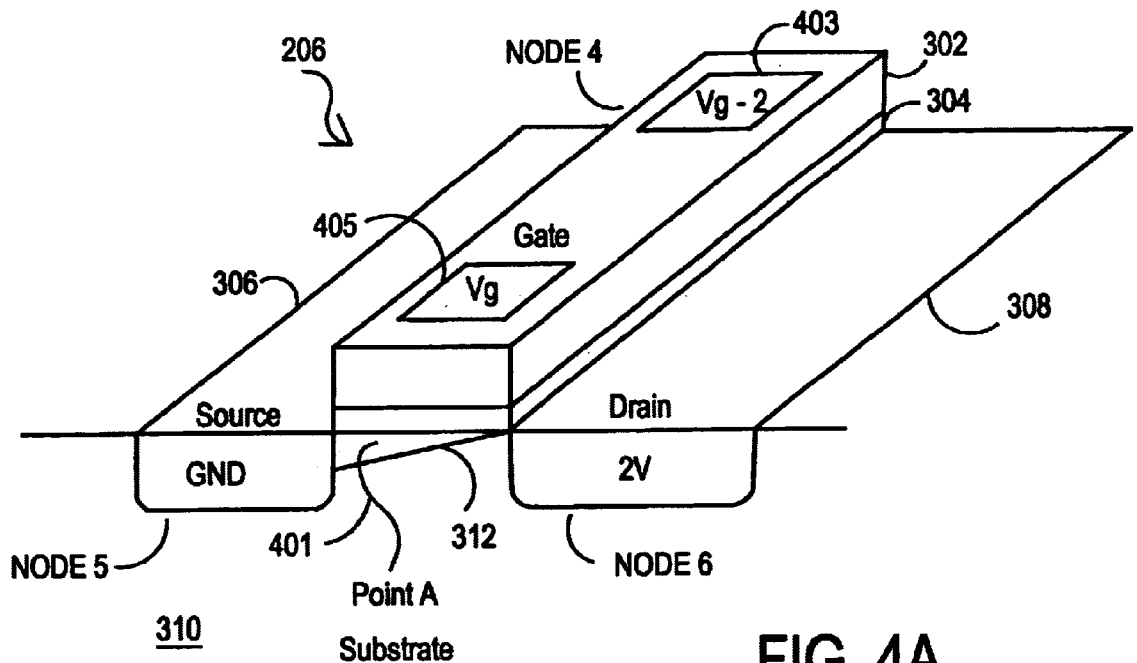
FIGS. 4A–4B are a cross-section perspective diagrams for further embodiments for the non-volatile antifuse element M1 in which additional voltage gradients are utilized.
Figure 4B:
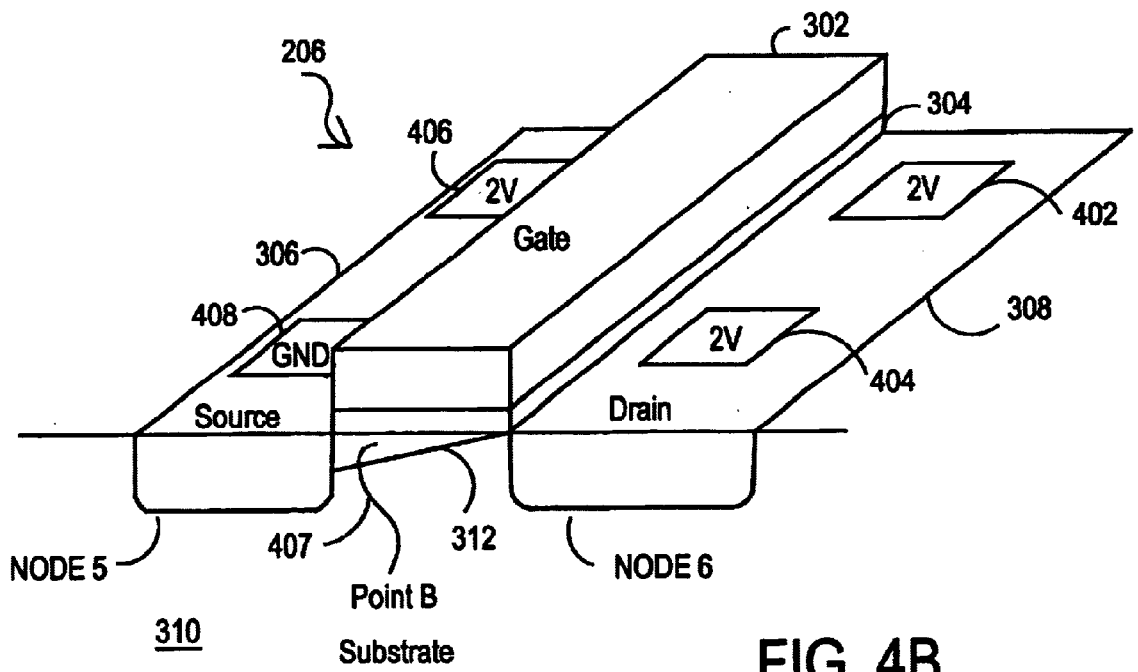

FIGS. 4A–4B are a cross-section perspective diagrams for further embodiments for the non-volatile antifuse element M1 in which additional voltage gradients are utilized. These embodiments further guide or crowd the current by applying a lateral field perpendicular to or in addition to the gradient that is formed across the channel. This additional lateral field can be created, for example, using a voltage gradient formed within the gate region and/or formed on one side of the channel using the source or drain regions.

FIG. 4A provides an example embodiment where an additional voltage gradient has been formed in the gate region. Compared to FIG. 3B, the embodiment in FIG. 4A. adds one voltage 405, such as Vg, applied to one end of the gate region and a second lower voltage 403, such as Vg-2, applied to the other end of the gate region. These voltages create an additional lateral voltage gradient that is roughly perpendicular to the voltage gradient 312 generated in the channel. This additional voltage gradient tends to guide or urge breakdown to occur near POINT A 401, which represents a region that is close to the source 306 and close to the front of the antifuse element 206 as depicted in FIG. 4A. The highest electric field across the oxide appears in the immediate area of POINT A, where the channel voltage is 0 volts, and where the rest of the channel has a voltage above 0 volts, the voltage gradients will cause breakdown to occur at or near POINT A.

FIG. 4B provides another example embodiment where an additional voltage gradient has been formed in the source region. Compared to FIG. 3B, the embodiment in FIG. 4B adds one voltage 406, such as 2 volts, applied to one end of the source region and a second lower voltage 408, such as ground, applied to the other end of the source region. The drain region includes two ends as well, and as depicted, these ends are both kept at the higher voltage, such as 2 volts, as represented by voltages 402 and 404. The voltage differences in the source region create an additional lateral voltage gradient that is roughly perpendicular to the voltage gradient 312 generated in the channel. This additional voltage gradient tends to urge breakdown to occur near POINT B 407, which represents a region that is close to the source 306 and close to the front of the antifuse element 206 as depicted in FIG. 4B, again where the highest electric field is present across the oxide.

The benefits of using one or more voltage gradients within the antifuse element 206, therefore, include: (1) a reduction in the effective area of the dielectric that is conducting current, (2) guiding and confining the highest electric field to the area close to the source or drain connection, (3) making more consistent the resistance of the conductive oxide by causing the breakdown to occur consistently near the source, and (4) focusing the oxide breakdown to occur near a particular region or point within the dielectric. It is noted that the use of one or more voltage gradients could be implemented and configured in a variety of ways, as desired, to achieve the advantages provided by the use of voltage gradients. FIG. 3B simply provides one example of how a single voltage gradient could be utilized to focus current flow and oxide breakdown. And FIGS. 4A and 4B simply provide examples of how multiple gradients could be utilized to focus current flow and oxide breakdown.

The above described structures produce antifuse elements that can be programmed with internally generated high voltage. Preferably, a single pulse could be used to cause breakdown and write the antifuse element. However, it may often be the case that a single pulse of sufficient voltage may not be practical and that available on-chip voltages for a single pulse may be insufficient to breakdown the structure. In such cases, therefore, a programming method can be utilized, such as a series of voltage pulses, to make sure that the element is programmed by quickly reaching the required $Q_{bd}$ to cause breakdown of the dielectric.

As discussed above with respect to FIG. 2, the breakdown charge is supplied by the capacitor C1, and this charge is limited by the amount of charge stored by the capacitor. In other words, the current through the oxide is dependent on the applied voltage, and to increase the current through the oxide, a maximum voltage is desirably applied. The structure of FIG. 2 relies upon the charge stored in the capacitor C1, and as the current flows through the dielectric, the voltage on the capacitor C1 decreases. This decrease in voltage will cause a significant decrease in current flow. Capacitor C1 is first pre-charged to a voltage level through transistor M2, while NODE 3 is held to ground, then NODE 3 is boosted to produce a large voltage on NODE 4. Therefore, to quickly attain the $Q_{bd}$ through the dielectric, the capacitor C1 can be recharged shortly after it is boosted, so that the voltage can be restored and again applied to the dielectric. This repetitive charging and boosting to apply high voltage peaks to the dielectric will tend to maximize the current flow through the oxide and allow the element to be programmed in a short time period.

Thus, to better utilize the above described structure for a programmable memory element, it is desirable to utilize a programming method that rapidly and repeatedly pulses the memory element with high voltages pulses. This pulsing will then produce the required current through the oxide to cause the degradation and subsequent breakdown that is required to program or write the antifuse element. The actual implementation can be done in many ways. Two basic approaches to writing the antifuse element with this multiple pulse technique include: (1) using a fixed number of pulses that can be applied rapidly and then sensing the state of the cell to see if the write is complete, and (2) using pulses and continuously monitoring the state of the cell to detect if the write has completed. The second technique, however, has the drawback that the frequency of the pulses may be limited to allow time for the state of the element to be correctly detected.

Figure 5A:
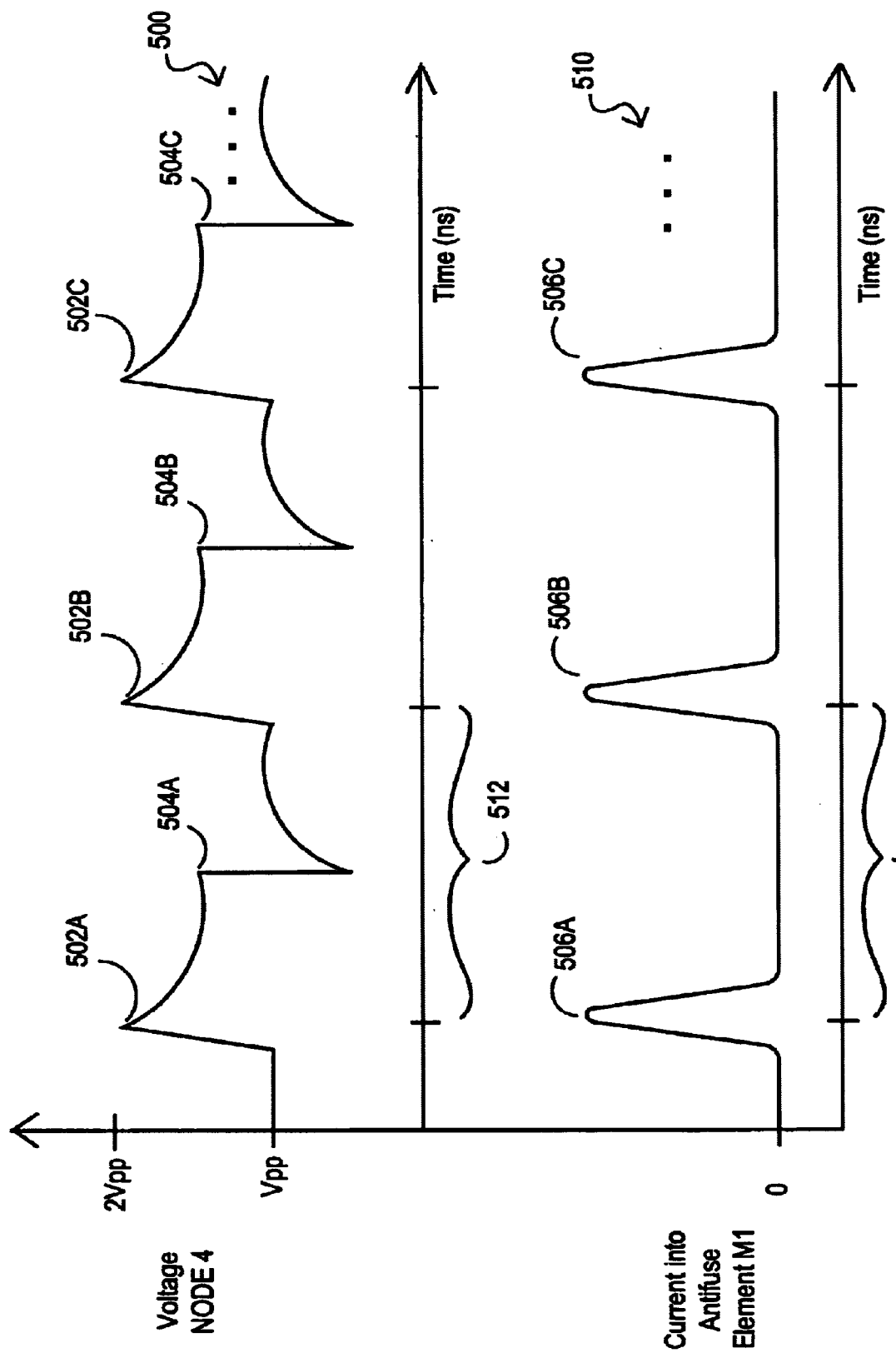
FIG. 5A is a graphical diagram for writing to the non-volatile antifuse element M1 including voltage pulses at NODE 4 and corresponding current flows from NODE 4 into the gate of the antifuse element M1.

FIG. 5A is a graphical diagram for writing to the non-volatile antifuse element M1 including voltage pulses at NODE 4 of FIG. 2 and corresponding current flows through NODE 4. In particular, graph 500 represents voltage pulses applied to NODE 4, and graph 510 represents corresponding current flow through NODE 4 into the antifuse element M1. As discussed above, NODE 4 is first pre-charged to a voltage, such as Vpp. Then, the capacitor C1 is hit with a voltage pulse of Vpp, thereby driving NODE 4 to approximately 2Vpp. Each spike 502A, 502B, 502C . . . represents one of these pulsing events, and each current spike 506A, 506B, 506C . . . represents a corresponding rapid current flow into the antifuse element M1. If desired, the pre-charging event can also occur each cycle so that NODE 4 is brought back to Vpp before the next pulse. Each voltage drop 504A, 504B, 504C . . . represents one of these pre-charging events. As depicted in FIG. 5A, each pulse is separated from the previous pulse by a finite time amount 512. It is noted that the number of pulses and the time between pulses can be modified, as desired. The pulses can be, for example, about 1000 pulses or more spaced at 30–50 nanoseconds apart or less. This pulse cycle can then be followed by a read cycle where it is verified whether or not the write was effective.

The rapid pulse cycle technique provides a number of advantages, including: (1) sufficient current can be supplied by rapid pulses, (2) a small capacitor can be exchanged for large number of pulses of current within the antifuse element 206, and (3) high frequency operation can result in relatively fast program times.

Figure 5B:
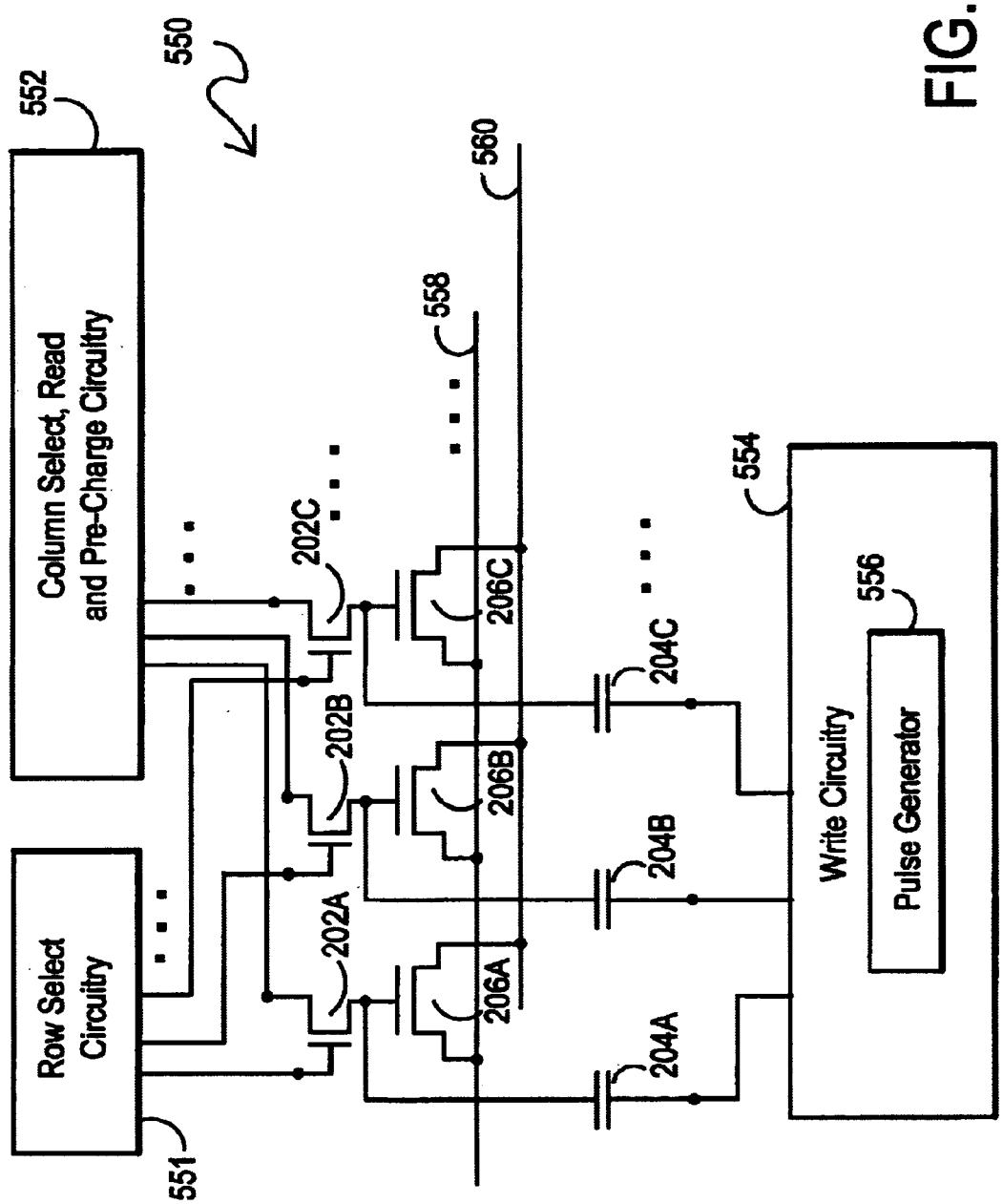
FIG. 5B is an example block diagram depicting non-volatile memory cells according to the present invention coupled to other control circuitry.

FIG. 5B is an example block diagram depicting non-volatile memory cells according to the present invention coupled to write control circuitry 554 including a pulse generator 556 and coupled to pre-charge and read control circuitry 552. The memory array architecture 550 includes a plurality of non-volatile memory cells, which include anti-fuse elements 206A, 206B, 206C . . . , access devices 202A, 202B, 202C . . . , and boost capacitors 204A, 204B, 204C . . . , respectively. The source nodes (NODE 5) of the antifuse elements are coupled to line 558, and the drain nodes (NODE 6) of the antifuse elements are coupled to line 560. As discussed above, lines 558 and 560 can be used to generate a voltage gradients within the antifuse elements.

Row select circuitry 551 can be coupled to the control nodes (NODE 1) for access devices 202A. 202B, 202C . . . to provide access control to the internal programming nodes (NODE 4) and the antifuse elements 206A of the non-volatile memory cells. The row select circuitry 551 can also provide the row selection within an array of non-volatile memory cells. Column select, read and pre-charge circuitry 552 can be coupled to output nodes (NODE 2) of the non-volatile memory cells to provide read and pre-charge operations, as discussed above. The circuitry 552 can also provide the column selection within an array of non-volatile memory cells. Write control circuitry 554, including a pulse generator 556, can be coupled to the input nodes (NODE 3) of the boost capacitors 204A, 204B and 204C to provide the voltage boost and pulse cycle activities discussed with respect to FIG. 5A above. Using the pulse write cycle implementation discussed above, the read portion of circuitry 552 can also be used to provide the verification operation to determine if the pulse cycle had been effective in writing to the antifuse elements. It is noted that a wide variety of implementations could be utilized, as desired, with respect to the organization of the non-volatile memory cells of the present invention. Thus, the particular organization provided in FIG. 5B should be understood as just one example for how the row and column circuitry could be organized. One such modified organization, for example, could be to swap the row and column designations as they are depicted in FIG. 5B, such that NODE 2 of each non-volatile memory cell is used for row selection, and NODE 1 of each non-volatile memory cell is used for column selection.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures for database processing. For example, equivalent elements may be substituted for those illustrated and described herein, and certain features of the invention may be utilized independently of the use of other features, all as would be apparent to one skilled in the art after having the benefit of this description of the invention.

What is claimed is:

1. A non-volatile memory cell integratable with other CMOS circuitry, comprising:
   an antifuse element having a programming node, the antifuse element being configured to have reduced resistivity after the programming node is subjected to one or more voltage pulses, the change in resistivity representing a change in logic state; and
   a capacitor element coupled to the antifuse element and configured to provide the one or more voltage pulses to the programming node.

2. The non-volatile memory cell of claim 1, further comprising an access element coupled to the programming node, the access element configured to allow pre-charging of the programming node.

3. The non-volatile memory cell of claim 2, wherein the access element comprises a MOS transistor having its gate coupled to a control node and having its source and drain coupled between the programming node and an external node.

4. The non-volatile memory cell of claim 2, wherein the access element is further configured to allow determination of the logic state for the antifuse element.

5. The non-volatile memory cell of claim 4, wherein the logic state of the antifuse element is determined by current flow through the MOS transistor access element.

6. The non-volatile memory cell of claim 2, wherein the programming node is pre-charged to a first voltage and the one or more voltage pulses applied to the capacitor element is utilized to bring the programming node to a second voltage, the second voltage exceeding double the first voltage.

7. The non-volatile memory cell of claim 1, wherein the antifuse element comprises a first conductive layer coupled to the programming node, a second conductive layer and a dielectric layer coupled between the first conductive layer and the second conductive layer.

8. The non-volatile memory cell of claim 1, wherein the antifuse element comprises a MOS transistor having its source and drain connected to one or more voltage levels, having a gate that provides the programming node, and having a dielectric layer that provides an antifuse function by breaking down when subjected to one or more voltage pulses.

9. The non-volatile memory cell of claim 8, wherein the antifuse element comprises an NMOS transistor.

10. The non-volatile memory cell of claim 8, wherein the source and drain of the MOS transistor antifuse element are coupled to the same voltage level.

11. The non-volatile memory cell of claim 8, wherein the source and drain of the MOS transistor antifuse element are coupled different voltage levels.

12. The non-volatile memory cell of claim 8, wherein the dielectric layer comprises silicon dioxide.

13. The non-volatile memory cell of claim 1, wherein the capacitor element comprises a MOS transistor configured to have its gate provide one terminal of the capacitor element and to have its source and drain connected together to provide a second terminal of the capacitor element.

14. The non-volatile memory cell of claim 1, wherein the capacitor element comprises two conductive layers of metal or polysilicon and a dielectric layer.

15. A method of operating a non-volatile memory cell integratable with other CMOS circuitry, comprising:
   providing a non-volatile memory cell, comprising:
      an antifuse element having a programming node, the antifuse element being configured to have reduced resistivity after the programming node is subjected to one or more voltage pulses, the change in resistivity representing a change in logic state;
      a capacitor element coupled to the antifuse element and configured to provide one or more voltage pulses to the programming node; and
   writing to the non-volatile memory cell by applying one or more voltage pulses to the capacitor element.

16. The method of claim 15, further comprising providing an access element coupled to the programming node and pre-charging the programming node through the access element.

17. The method of claim 16, further comprising pre-charging the programming node to a first voltage and applying one or more voltage pulses to the capacitor element to bring the programming node to a second voltage, the second voltage exceeding double the first voltage.

18. The method of claim 15, further comprising providing an access element coupled to the programming node and utilizing the access element to determine the logic state for the antifuse element.

19. The method of claim 18, further comprising reading the logic state of the non-volatile memory cell by accessing the programming node through the access element, the current flowing through the programming node representing the logic state.

20. The method of claim 15, wherein the writing step comprises checking the logic state of the non-volatile memory cell to verify whether or not a write operation has been successful.

21. The method of claim 15, wherein the antifuse element comprises a MOS transistor having its source and drain connected to one or more voltage levels, having a gate that provides the programming node, and having a dielectric layer that provides an antifuse function by breaking down when subjected to one or more voltage pulses.

22. The method of claim 21, further comprising generating one or more voltage gradients within the antifuse element in order to guide a location for breakdown to occur within the dielectric layer of each antifuse element.

23. An embedded non-volatile memory integrated with other CMOS circuitry, comprising:
   a plurality of non-volatile memory cells, each cell comprising:

an antifuse element having a programming node, the antifuse element being configured to have reduced resistivity after the programming node is subjected to one or more voltage pulses, the change in resistivity representing a change in logic state;

a capacitor element coupled to the antifuse element and configured to provide one or more voltage pulses to the programming node; and an access element coupled to the programming node, the access element configured to allow determination of the logic state for the antifuse element; and write circuitry coupled to the capacitor elements of the plurality of non-volatile memory cells, the write circuitry configured to provide one or more voltage pulses to the capacitor elements.

24. The embedded non-volatile memory of claim 23, further comprising read circuitry coupled to access the programming nodes of the plurality of non-volatile memory cells through the access elements and to determine a logic state of one or more non-volatile memory cells, the current flowing through each programming node representing the logic state of that non-volatile memory cell.

25. The embedded non-volatile memory of claim 23, wherein each antifuse element comprises a MOS transistor having its source and drain connected to one or more voltage levels, having a gate that provides the programming node, and having a dielectric layer that provides an antifuse function by breaking down when subjected to one or more voltage pulses.

26. An embedded non-volatile memory integrated with other CMOS circuitry, comprising:

a plurality of non-volatile memory cells, each cell comprising:

a programming node, the cell being configured to change logic state when the programming node is subjected to one or more voltage pulses;

a capacitor element coupled to the programming node, the capacitor element being configured to provide one or more voltage pulses to the programming node; and an access element coupled to the programming node, the access element configured to allow determination of the logic state for the cell; and write circuitry coupled to the capacitor elements of the plurality of non-volatile memory cells, the write circuitry configured to provide one or more voltage pulses to the capacitor elements.

27. The embedded non-volatile memory of claim 26, wherein each memory cell further comprises an antifuse element, the antifuse element being configured to have reduced resistivity after the programming node is subjected to one or more voltage pulses, the change in resistivity representing a charge in logic state for the cell.

28. The embedded non-volatile memory of claim 27, wherein each antifuse element comprises a MOS transistor having its source and drain connected to one or more voltage levels, having a gate that provides the programming node, and having a dielectric layer that provides an antifuse function by breaking down when subjected to one or more voltage pulses.

29. The embedded non-volatile memory of claim 26, wherein the programming node is pre-charged to a first voltage and the one or more voltage pulses applied to the capacitor element is utilized to bring the programming node to a second voltage, the second voltage exceeding double the first voltage.

* * * * *

UNITED STATES PATENT AND TRADEMARK OFFICE
CERTIFICATE OF CORRECTION

PATENT NO. : 6,775,197 B2 Page 1 of 1
DATED : August 10, 2004
INVENTOR(S) : David Novosel and Gary S. Craig It is certified that error appears in the above-identified patent and that said Letters Patent is hereby corrected as shown below:

Column 14,
Line 19, please delete "charge" and insert -- change --.

Signed and Sealed this

Twenty-first Day of December, 2004

JON W. DUDAS
*Director of the United States Patent and Trademark Office*